US012587205B2

(12) United States Patent
Terryn

(10) Patent No.: US 12,587,205 B2
(45) Date of Patent: Mar. 24, 2026

(54) LOW-OFFSET HIGH SPEED REFERENCE BUFFER

(71) Applicant: SEMICONDUCTOR COMPONENTS INDUSTRIES, LLC, Scottsdale, AZ (US)

(72) Inventor: Steven Terryn, De Pinte (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 204 days.

(21) Appl. No.: 18/667,186

(22) Filed: May 17, 2024

(65) Prior Publication Data

US 2025/0357941 A1 Nov. 20, 2025

(51) Int. Cl.
*H03M 1/38* (2006.01)
*H03K 5/02* (2006.01)

(52) U.S. Cl.
CPC ............... *H03M 1/38* (2013.01); *H03K 5/02* (2013.01)

(58) Field of Classification Search
CPC ........... H03M 1/38; H03M 1/462; H03M 1/34
USPC ......................... 341/155, 122, 118, 120, 161
See application file for complete search history.

(56) References Cited

U.S. PATENT DOCUMENTS

| | | | |
|---|---|---|---|
| 4,585,956 A | 4/1986 | Lie | |
| 2006/0139199 A1* | 6/2006 | Casper | H03M 1/403 |
| | | | 341/155 |
| 2009/0315531 A1 | 12/2009 | Liao | |
| 2014/0333465 A1 | 11/2014 | Elsayed | |
| 2016/0380660 A1* | 12/2016 | Polley | H04B 1/0028 |
| | | | 375/350 |

FOREIGN PATENT DOCUMENTS

CN          114614819 A      6/2022

* cited by examiner

*Primary Examiner* — Peguy Jean Pierre
(74) *Attorney, Agent, or Firm* — Slayden Grubert Beard PLLC

(57) ABSTRACT

A reference buffer is disclosed. The reference buffer includes an amplifier configured to amplify a difference between a reference output voltage and a reference input voltage during a closed-loop phase of the reference buffer. The reference buffer also includes a sample circuit configured to sample an amplifier output voltage during the closed-loop phase. The reference buffer further includes a buffer circuit having a buffer input coupled to the sample circuit and a buffer output configured to provide the reference output voltage. The reference buffer also includes first and second switch circuits. The first switch circuit is configured to isolate the sample circuit from the output stage of the amplifier during an open-loop phase of the reference buffer. The second switch circuit is configured to isolate the input stage from the output of the reference buffer during the open-loop phase.

20 Claims, 5 Drawing Sheets

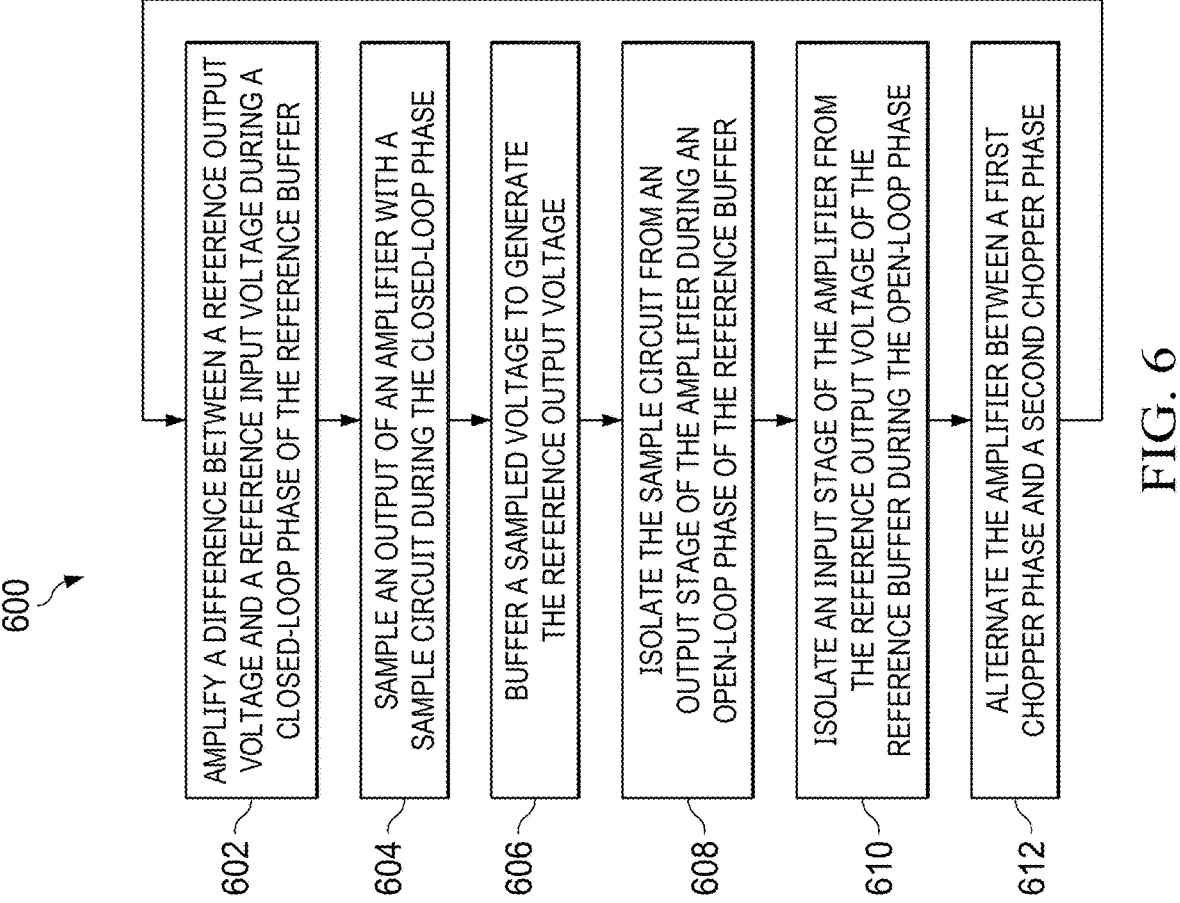

600

602 — AMPLIFY A DIFFERENCE BETWEEN A REFERENCE OUTPUT VOLTAGE AND A REFERENCE INPUT VOLTAGE DURING A CLOSED-LOOP PHASE OF THE REFERENCE BUFFER

604 — SAMPLE AN OUTPUT OF AN AMPLIFIER WITH A SAMPLE CIRCUIT DURING THE CLOSED-LOOP PHASE

606 — BUFFER A SAMPLED VOLTAGE TO GENERATE THE REFERENCE OUTPUT VOLTAGE

608 — ISOLATE THE SAMPLE CIRCUIT FROM AN OUTPUT STAGE OF THE AMPLIFIER DURING AN OPEN-LOOP PHASE OF THE REFERENCE BUFFER

610 — ISOLATE AN INPUT STAGE OF THE AMPLIFIER FROM THE REFERENCE OUTPUT VOLTAGE OF THE REFERENCE BUFFER DURING THE OPEN-LOOP PHASE

612 — ALTERNATE THE AMPLIFIER BETWEEN A FIRST CHOPPER PHASE AND A SECOND CHOPPER PHASE

FIG. 6

LOW-OFFSET HIGH SPEED REFERENCE BUFFER

TECHNICAL FIELD

The disclosure relates generally to electrical circuits, and particularly to a high-speed, low-offset reference buffer.

BACKGROUND

An analog-to-digital converter (ADC) is an electrical circuit that may convert an analog input signal into a digital signal that represents the value of the analog signal. One type of ADC is a Successive Approximation Register (SAR) ADC. A reference buffer may be utilized to provide a reference voltage to an ADC such as a SAR ADC. The inventor of embodiments of the present disclosure has recognized that reference buffers for an ADC such as a SAR ADC may need a fast transient response time, but with minimum power consumption. The inventor of embodiments of the present disclosure has also recognized that any systematic or random offset from the reference buffer may translate into a gain error for the ADC. Embodiments of the present disclosure may address one or more of these challenges.

BRIEF DESCRIPTION OF THE DRAWINGS

A more complete understanding of the present embodiments may be acquired by referring to the following description taken in conjunction with the accompanying drawings, in which like reference numbers indicate like features.

FIG. 6 illustrates a method for buffering a reference voltage in accordance with embodiments of the present disclosure.

DETAILED DESCRIPTION

Details of one or more embodiments are set forth in the description below and the accompanying drawings. Other features will be apparent from the description, drawings, and from the claims.

Figures 1, 2:
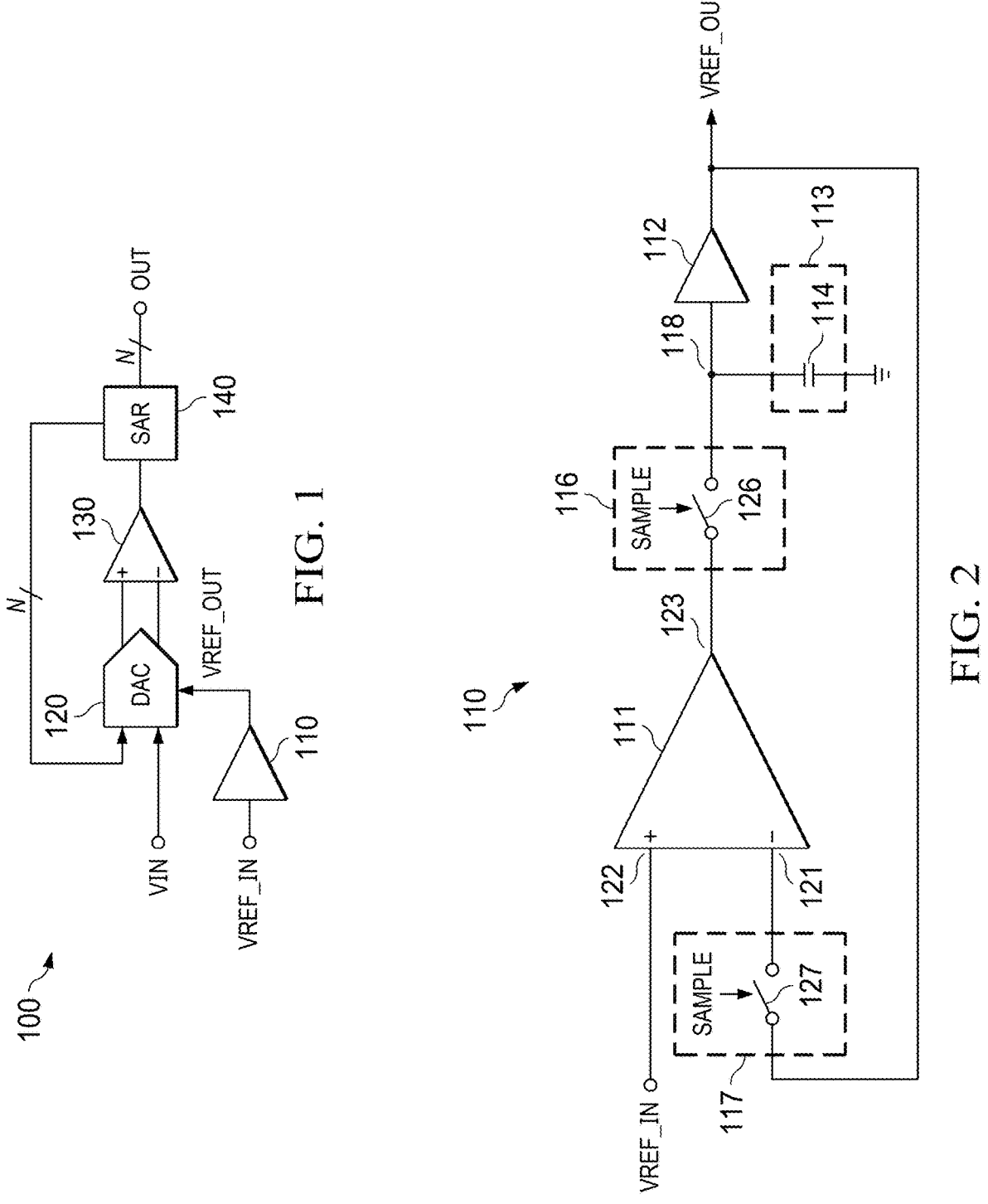
FIG. 1 illustrates a schematic diagram of an ADC in accordance with embodiments of the present disclosure.
FIG. 2 illustrates a schematic diagram of a reference buffer in accordance with embodiments of the present disclosure.

FIG. 1 illustrates a schematic diagram of ADC 100 in accordance with embodiments of the present disclosure. ADC 100 may be implemented in any suitable fashion according to the operation described in the present disclosure. In some embodiments, ADC 100 may include a digital to analog converter (DAC) 120, comparator 130, successive-approximation register (SAR) 140, and reference buffer 110.

Reference buffer 110 may receive a reference input voltage VREF_IN. Reference buffer 110 may buffer VREF_IN and provide a reference output voltage VREF_OUT. In some embodiments, VREF_OUT may be equal to the reference input voltage VREF_IN. Reference buffer 110 may be configured to provide a stable reference output voltage VREF_OUT despite varied loading from DAC 120 during successive sample and conversion phases of the conversion process.

DAC 120 may be configured to receive an input voltage VIN, the buffered reference output voltage VREF_OUT from reference buffer 110, and a digital feedback signal from SAR 140 with an N number of bits. DAC 120 may be a capacitive digital-to-analog converter (capacitive DAC) that uses switched capacitor circuitry to sample the input voltage VIN. For example, DAC 120 may include an N number of switched capacitor circuits, each corresponding to one of the N number of bits of SAR 140. Each of the N number of switched capacitor circuits may include a capacitor with a capacitance that is scaled to its respective corresponding bit position.

To generate an N-bit digital output, ADC 100 may proceed through a sample phase and an N number of successive conversion steps during the conversion phase. During the sample phase, DAC 120 may sample VIN. Subsequently, during each of the N number of conversion steps, ADC 100 may determine one bit of the N-bit digital output (and the N-bit digital feedback signal), starting with the most significant bit and ending with the least significant bit. For example, a 4-bit embodiment of ADC 100 may begin with SAR 140 setting a 4-bit mid-point value of 0111. For each bit position with a "1," the capacitor of the corresponding switch capacitor circuit within DAC 120 may be charged to a value of VREF_OUT. For each bit position with a "0," the capacitor of the corresponding switch capacitor circuit within DAC 120 may be discharged to a negative reference value such as ground GND. The charge may then be redistributed over the total DAC capacitance, and DAC 120 may output a differential signal to comparator 130. Based on the differential output from DAC 120, comparator 130 may generate a comparison signal. If the differential output of DAC 120 is positive, comparator may output a logic-1. And if the differential output of DAC 120 is negative, comparator may output a logic-0. SAR 140 may be coupled to receive the comparison signal from comparator 130 and to provide the N-bit digital feedback signal to DAC 120. For example, SAR 140 may store the output of comparator 130 in the most-significant bit position. After determining the most-significant bit, SAR 140 may move to the next successive bit, setting the remaining three bits at a mid-point value of 011. The above conversion step may be repeated until each of the 4 bits is successively determined and the conversion phase is thus complete. After completion of the N-bit conversion steps during the conversion phase, the N-bit output signal from SAR 140 may provide a digital representation of the analog VIN signal.

Although the example above has been described in the context of a 4-bit SAR ADC, ADC 100 may be implemented with more or less bits than 4. ADC 100 may be implemented as, for example, an ADC with 4 bits, 6 bits, 8 bits, 10 bits, 12 bits, 14 bits, or more.

FIG. 2 illustrates a schematic diagram of reference buffer 110 in accordance with embodiments of the present disclosure. Reference buffer 110 may be implemented in any suitable fashion according to the operation described in the present disclosure. In some embodiments, reference buffer 110 may include amplifier 111, buffer circuit 112, and sample circuit 113, as well as first switch circuit 116, and second switch circuit 117.

Amplifier 111 may be an operational amplifier. Amplifier 111 may have a first input 121 and a second input 122. In some embodiments, the first input 121 may be the negative input of amplifier 111, and the second input 122 may be the positive input of amplifier 111. Amplifier 111 may amplify a difference between its first input 121 and its second input 122 and provide an amplifier output voltage at its amplifier output 123.

As shown in FIG. 2, reference buffer 110 may also include first switch circuit 116 and second switch circuit 117. In some embodiments, first switch circuit 116 may include first switch 126, and second switch circuit 117 may include second switch 127. First switch circuit 116 may be coupled between amplifier output 123 and sample circuit 113, to which buffer circuit 112 may also be coupled. Second switch circuit 117 may be coupled between the output of reference buffer 110 and first input 121 of amplifier 111. As described in further detail below, first switch circuit 116 and second switch circuit 117 may each have an open state during an open-loop phase of reference buffer 110, and may each have a closed state during a closed-loop phase of reference buffer 110.

In some embodiments, sample circuit 113 may be coupled to first switch circuit 116 at node 118. Sample circuit 113 may be configured to sample the amplifier output voltage from amplifier 111 during the closed-loop phase of reference buffer 110, and may hold the sampled voltage level during the open-loop phase of reference buffer 110. For example, sample circuit 113 may include capacitor 114 that may be coupled between node 118 and ground GND, and thus may be configured to sample the amplifier output voltage from amplifier 310 during the closed-loop phase of reference buffer 110, and may hold the sampled voltage level during the open-loop phase of reference buffer 110.

Buffer circuit 112 may have a buffer input coupled to sample circuit 113 at node 118, and a buffer output coupled to drive the output of reference buffer 110. For example, buffer circuit 112 may provide the reference output voltage VREF_OUT at its output corresponding to the voltage at its buffer input.

Reference buffer 110 may operate with alternating first and second phases. The first phase of reference buffer 110 may correspond to the sample phase of ADC 100 as described above with reference to FIG. 1. During the first phase, a SAMPLE signal may drive first switch circuit 116 and second switch circuit 117 in a closed state. When first switch circuit 116 and second switch circuit 117 are in a closed state, reference buffer 110 may operate in a closed loop. Accordingly, the first phase of reference buffer 110 may also be referred to as a closed-loop phase for the purposes of the present disclosure. During the closed-loop phase, amplifier 111 may amplify a difference between the reference output voltage VREF_OUT and the reference input voltage VREF_IN, and may provide an amplifier output voltage to sample circuit 113 and buffer circuit 112 at node 118. The closed-loop configuration may cause amplifier 111 and buffer circuit 112 to bring VREF_OUT to a voltage level that is equal to VREF_IN (notwithstanding any differences due to amplifier offset or the non-infinite gain of amplifier 111).

The second phase of reference buffer 110 may correspond to the conversion phase of ADC 100 as described above with reference to FIG. 1. During the second phase, the SAMPLE signal may be de-asserted and first switch circuit 116 and second switch circuit 117 may be driven in an open state. Accordingly, the second phase of reference buffer 110 may also be referred to as an open-loop phase.

During the open-loop phase, amplifier 111 may be isolated from sample circuit 113 and buffer circuit 112. For example, second switch circuit 117 may be in an open state and may thus isolate first input 121 of amplifier 111 from the output of reference buffer 110. Accordingly, any noise or voltage spikes due to the varied capacitive loading at the output of reference buffer 110 during the conversion phase of ADC 100 may be blocked from entering amplifier 111. Further, first switch circuit 116 may be in an open state and may thus isolate sample circuit 113 at node 118 from the amplifier output 123 during the open-loop phase.

As described above, sample circuit 113 may include capacitor 114. Capacitor 114 may sample the amplifier output voltage during the closed-loop phase, and may hold the sampled voltage level of the amplifier output voltage during the open-loop phase. Accordingly, buffer circuit 112 may continue to output VREF_OUT at a voltage level equal to that of VREF_IN based on the sampled voltage at node 118 during the open-loop phase.

In some embodiments, the reference buffer 110 may repeatedly alternate between the closed-loop phase and the open-loop phase. For example, repeated closed-loop phases of reference buffer 110 may correspond to repeated sample phases of ADC 100, and repeated open-loop phases of reference buffer 110 may correspond to repeated conversion phases of the ADC 100. By alternating between closed-loop operation during the closed-loop phase and the open-loop operation during the open-loop phase, reference buffer 110 may benefit from the accuracy of the closed-loop operation as well as from the high bandwidth of the open-loop operation. For example, during the sample phase of ADC 100, reference buffer 110 will not be subject to the switching capacitive loads of DAC 120 that are incurred during the conversion steps of the conversion phase of ADC 100. Thus, the closed-loop operation of reference buffer 110 may allow VREF_OUT to settle to the correct value at a low bandwidth during the sample phase of ADC 100. Subsequently, the open-loop operation of reference buffer 110 may provide a high-bandwidth output able to quickly settle any transient spikes resulting from the switched capacitive loading occurring the during conversion phase of ADC 100.

Figure 3:
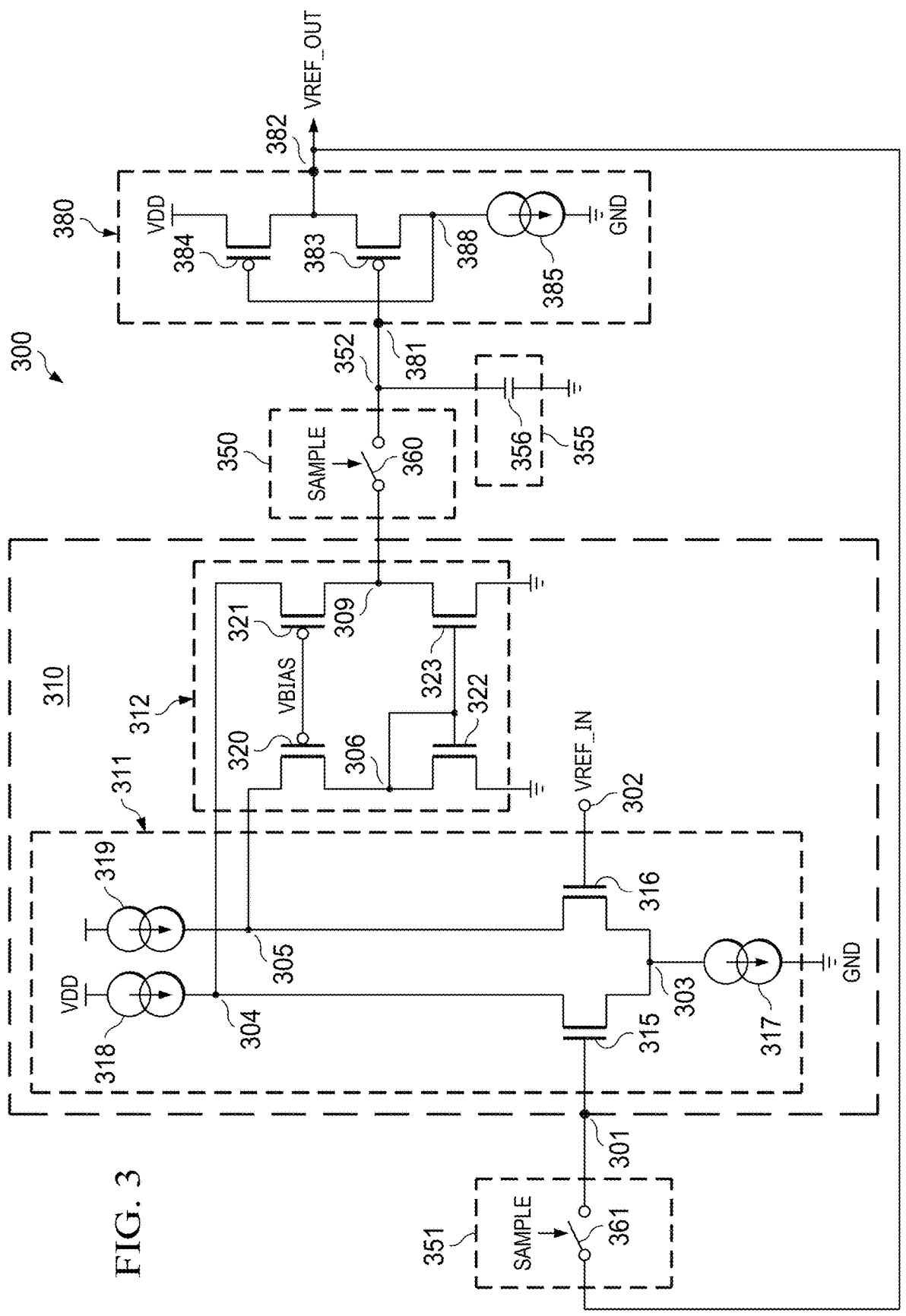
FIG. 3 illustrates a transistor-level schematic diagram of a reference buffer in accordance with embodiments of the present disclosure.

FIG. 3 illustrates a transistor-level schematic diagram of reference buffer 300 in accordance with embodiments of the present disclosure. In some embodiments, reference buffer 300 may serve as the reference buffer 110 for a SAR ADC such as ADC 100 described above. Reference buffer 300 may be implemented in any suitable fashion according to the operation described in the present disclosure. In some embodiments, reference buffer 300 may include amplifier 310, first switch circuit 350, second switch circuit 351, sample circuit 355, and buffer circuit 380.

Amplifier 310 may be an operational amplifier. Amplifier 310 may be implemented in any suitable fashion according to the operation described in the present disclosure. Amplifier 310 may include input stage 311 and output stage 312. Although input stage 311 and output stage 312 are described below as separate stages of amplifier 310, input stage 311 and output stage 312 may in some embodiments both be formed by a single amplification stage of a single-stage amplifier.

Input stage 311 of amplifier 310 may include transistors 315 and 316 and current sources 317, 318, and 319. A first input 301 of amplifier 310 may be coupled to the gate of transistor 315, and a second input 302 of amplifier 310 may be coupled to the gate of transistor 316. In some embodiments, first input 301 may be the negative input of amplifier 310 and second input 302 may be the positive input of amplifier 310. In some embodiments, transistors 315 and 316 may each be an N-type metal-oxide semiconductor field-effect transistor ("N-type MOSFET" or "NMOS transistor"). Transistors 315 and 316 may form a differential pair, with their respective sources coupled together at node 303. Transistors 315 and 316 may be biased by current source 317, which may be coupled between node 303 and ground GND. Further, transistor 315 may have a drain coupled to current source 318 at node 304, and transistor 316 may have a drain coupled to current source 319 at node 305. Current sources 318 and 319 may be configured to source the same amount of current as each other. For example, current sources 318 and 319 may in some embodiments be two matching branches of a current mirror circuit configured to output matching currents. The differential pair formed by transistors 315 and 316 may draw different amounts of current from nodes 304 and 305 respectively based on the difference in the voltage levels received at the first input 301 and second input 302. Accordingly, different amounts of current may be provided to output stage 312 of amplifier 310. Specifically, different amounts of current may be provided to transistors 320 and 321 of output stage 312 based on the difference in the voltage levels received at the first and second inputs 301 and 302.

Output stage 312 may include transistors 320 and 321 as well as transistors 322 and 323. Transistors 320 and 321 may be configured as a cascode with their respective gates both driven by a bias voltage VBIAS. Transistors 320 and 321 may, in some embodiments, each be a P-type metal-oxide semiconductor field-effect transistor ("P-type MOSFET" or "PMOS transistor"). Transistor 320 may have a source coupled to the drain of transistor 316 at node 305. Transistor 321 may similarly have a source coupled to the drain of transistor 315 at node 304.

In some embodiments, transistors 322 and 323 of output stage 312 may be NMOS transistors. Transistors 322 and 323 may be configured as a current mirror. Transistor 322 may have a drain coupled to the drain of transistor 320 at node 306, and a source coupled to ground GND. Transistor 323 may have a drain coupled to the drain of transistor 321 at node 309, and a source coupled to ground GND. The gates of transistors 322 and 323 may be coupled together and further to the drain of transistor 322 at node 306. Accordingly, output stage 312 of amplifier 310 may provide an amplifier output voltage at node 309 (which, for the purposes of the present disclosure, may also be referred to as amplifier output 309) based on the difference between the voltage levels received at the first input 301 and the second input 302 of amplifier 310.

As shown in FIG. 3, reference buffer 300 may also include first switch circuit 350 and second switch circuit 351. First switch circuit 350 may be coupled to output stage 312 of amplifier 310 and to sample circuit 355, to which buffer circuit 380 may also be coupled. Second switch circuit 351 may be coupled to the output of reference buffer 300 and to input stage 311 of amplifier 310. As described in further detail below, first switch circuit 350 and second switch circuit 351 may each have an open state during an open-loop phase of reference buffer 300, and may each have a closed state during a closed-loop phase of reference buffer 300.

As shown in FIG. 3, sample circuit 355 may be coupled to first switch circuit 350 at node 352. Sample circuit 355 may be configured to sample the amplifier output voltage from amplifier 310 during the closed-loop phase of reference buffer 300, and may hold the sampled voltage level during the open-loop phase of reference buffer 300. For example, sample circuit 355 may include capacitor 356 that may be coupled between node 352 and ground GND and thus may sample the amplifier output voltage from amplifier 310 during the closed-loop phase of reference buffer 300, and may hold the sampled voltage level during the open-loop phase of reference buffer 300.

Buffer circuit 380 may have a buffer input 381 coupled to sample circuit 355 at node 352, and a buffer output 382 coupled to provide VREF_OUT. Buffer circuit 380 may be implemented in any suitable fashion according to the operation described in the present disclosure. Buffer circuit 380 may generate and provide the voltage reference output VREF_OUT with a voltage level corresponding to the voltage received at its buffer input 381. For example, buffer circuit 380 may generate and provide VREF_OUT at a voltage level with a constant offset from the sampled voltage received at its buffer input 381. In some embodiments, buffer circuit 380 may include a flipped voltage follower. For example, buffer circuit 380 may include transistor 383, transistor 384, and current source 385. Transistors 383 and 384 may be PMOS transistors. Transistor 383 may have a drain coupled to current source 385 at node 388. Current source 385 may be coupled between node 388 and ground GND and may bias transistor 383. Transistor 383 may also have a gate coupled to buffer input 381 and a source coupled to buffer output 382. Further, transistor 384 may include a gate coupled to node 388, a source coupled to VDD, and a drain coupled to the source of transistor 383 at buffer output 382 of buffer circuit 380. Thus, as shown in FIG. 3, transistor 383 of buffer circuit 380 may operate as a flipped voltage follower biased by transistor 384 and current source 385. The flipped voltage-follower configuration may provide for a constant offset from buffer input 381 to buffer output 382 based on the gate-to-source voltage of transistor 383 under the bias of current source 385 and transistor 384.

Reference buffer 300 may operate with a first and a second phase. The first phase of reference buffer 300 may correspond to the sample phase of ADC 100 as described above with reference to FIG. 1. During the first phase, a SAMPLE signal may drive each of first switch circuit 350 and second switch circuit 351 in a closed state. When first switch circuit 350 and second switch circuit 351 are in a closed state, reference buffer 300 may operate in a closed loop. Accordingly, the first phase of reference buffer 300 may also be referred to as a closed-loop phase for the purposes of the present disclosure.

During the closed-loop phase, amplifier 310 may amplify any difference between the reference input voltage VREF_IN and the reference output voltage VREF_OUT received from the output of reference buffer 300 via second switch circuit 351. Amplifier 310 may thus provide an amplifier output voltage to sample circuit 355 and to buffer circuit 380 at node 352. The output amplifier output voltage may cause buffer circuit 380 to bring VREF_OUT to a voltage that is equal to VREF_IN (notwithstanding any differences due to amplifier offset or the non-infinite gain of amplifier 310).

The second phase of reference buffer 300 may correspond to the conversion phase of ADC 100 as described above with reference to FIG. 1. During the second phase, the SAMPLE signal may be de-asserted and first switch circuit 350 and second switch circuit 351 may each be driven in an open state. Accordingly, the second phase of reference buffer 300 may also be referred to as the open-loop phase.

During the open-loop phase, amplifier 310 may be isolated from sample circuit 355 and buffer circuit 380. For example, second switch circuit 351 may be in an open state and may thus isolate input stage 311 of amplifier 310 from VREF_OUT at the output of reference buffer 300. Accordingly, any noise or voltage spikes due to the varied capacitive loading at the output of reference buffer 300 during the conversion phase of ADC 100 may be blocked from entering the negative input 301 of amplifier 310. Further, first switch circuit 350 may also be in an open state during the open-loop phase, and may thus isolate sample circuit 355 and buffer input 381 of buffer circuit 380 from output stage 312 of amplifier 310.

As described above, sample circuit 355 may include capacitor 356. Capacitor 356 may sample the amplifier output voltage from amplifier 310 during the closed-loop phase, and may hold the sampled voltage level of the amplifier output voltage at node 352 during the open-loop phase. Accordingly, buffer circuit 380 may continue to output VREF_OUT at a voltage level equal to that of VREF_IN based on the sampled voltage at node 352 during the open-loop phase.

In some embodiments, the reference buffer 300 may repeatedly alternate between the closed-loop phase and the open-loop phase. Repeated closed-loop phases of reference buffer 300 may correspond to repeated sample phases of ADC 100, and repeated open-loop phases of reference buffer 300 may correspond to repeated conversion phases of the ADC 100. By alternating between closed-loop operation during the closed-loop phase and the open-loop operation during the open-loop phase, reference buffer 300 may benefit from the accuracy of the closed-loop operation as well as from the high bandwidth of the open-loop operation. For example, during the sample phase of ADC 100, reference buffer 300 will not be subject to the switching capacitive loads of the capacitive DAC that are incurred during the conversion steps of the conversion phase of ADC 100. Thus, the closed-loop operation of reference buffer 300 may allow VREF_OUT to settle to the correct value at a low bandwidth during the sample phase of ADC 100. Subsequently, the open-loop operation of reference buffer 300 may provide a high-bandwidth output able to quickly settle any transient spikes resulting from the switched capacitive loading occurring the during conversion phase of ADC 100.

The use of different phases for reference buffer 300 provides multiple advantages. The open-loop phase of reference buffer 300 may correspond to the conversion phase of a SAR ADC such as ADC 100 described above with reference to FIG. 1. During this phase, the output of reference buffer 300 may be subject to a switched capacitive loading of a capacitive DAC such as DAC 120. The open-loop configuration of reference buffer 300 during this phase provides a high-bandwidth, low-impedance output, capable of driving the switching load of a capacitive DAC. For example, the flipped voltage-follower configuration of buffer circuit 380 provides a low-impedance output that can quickly respond to a switching capacitive load at its output. Moreover, buffer circuit 380 only requires a small bias current, of for example, 10 μA, 1 μA, or less to bias the gate of transistor 384 and the flipped voltage-follower configuration of transistor 383. The flipped voltage-follower configuration may require less current to achieve the same bandwidth compared to a conventional voltage follower biased by a current source alone. The bias current consumed by reference buffer 300 as whole may thus be much less than the bias current that would otherwise be necessary to achieve a similar high-bandwidth with a continuously closed-loop system.

The closed-loop phase of reference buffer 300 may correspond to the sampling phase of a SAR ADC such as ADC 100 described above. During this phase, the output of reference buffer 300 may not have the same switched capacitive loading as during the conversion phase of the SAR ADC. However, any offset at the input of amplifier 310 may translate to a gain error for the SAR ADC in which reference buffer 300 may be implemented. Accordingly, reference buffer 300 may be configured to favor low offset as opposed to high-bandwidth during this closed-loop phase. In some embodiments, transistors 315 and 316 may be configured with large channel-width and channel-length dimensions to ensure good matching with each other, thereby minimizing the input offset of amplifier 310. Likewise, transistors 322 and 323 may be configured with large channel-width and channel-length dimensions to ensure good matching with each other, thereby minimizing the input offset of amplifier 310. In addition, as described above, current sources 318 and 319 may in some embodiments be two matching branches of a current mirror circuit configured to output matching currents. In some embodiments, the transistors forming the matching branches of the current mirror to form current sources 318 and 319 may likewise have large channel-width and channel-length dimensions to ensure good matching with each other.

Figure 4:
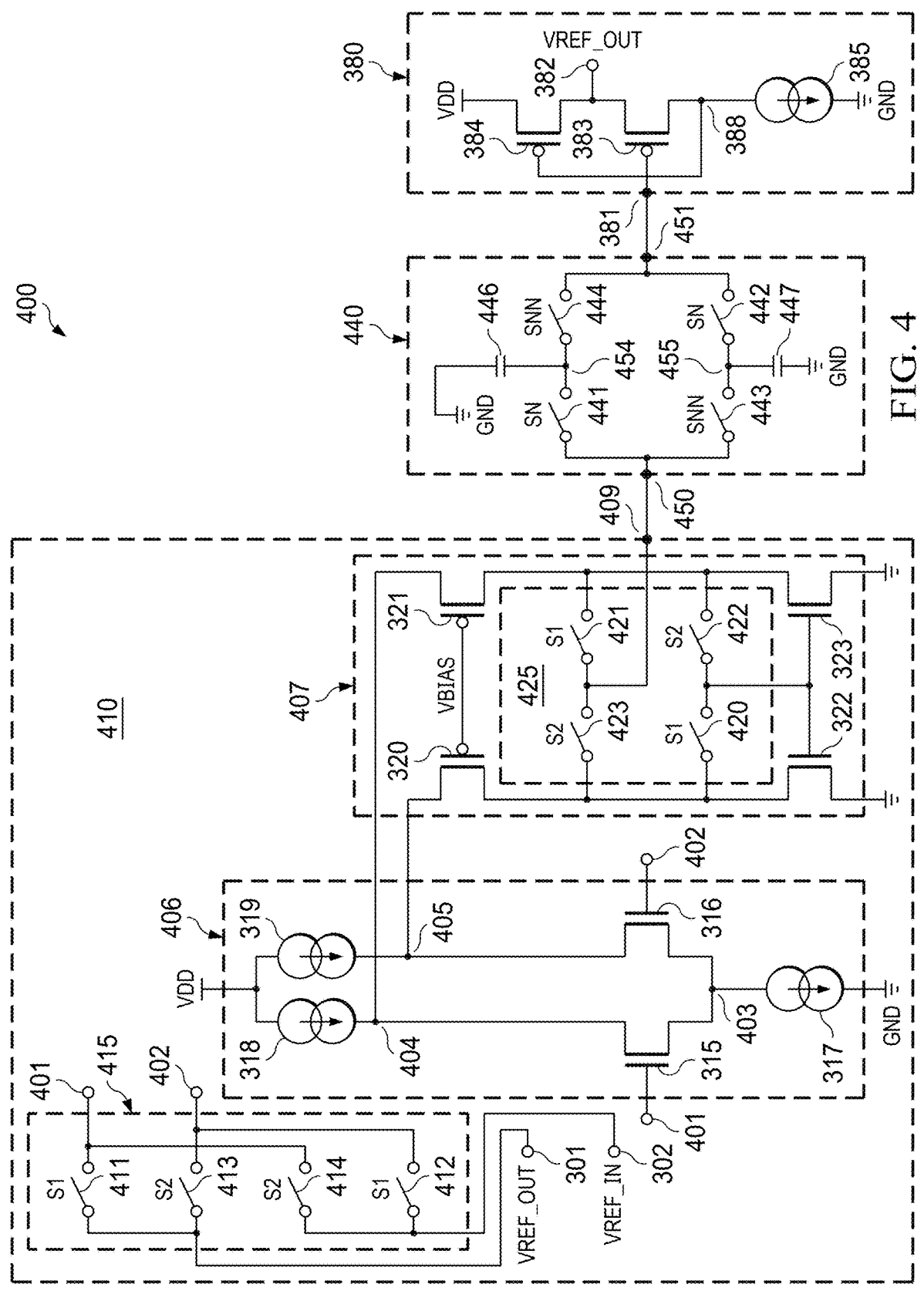
FIG. 4 illustrates a transistor-level schematic diagram of a reference buffer in accordance with embodiments of the present disclosure.

FIG. 4 illustrates a transistor-level schematic diagram of reference buffer 400 in accordance with embodiments of the present disclosure. Certain components of reference buffer 400 and amplifier 410 may be similar in certain respects to corresponding components in reference buffer 300 and amplifier 310 of FIG. 3. Thus, unless otherwise described or illustrated herein, the elements with like reference numbers in FIG. 4 may operate in a similar manner as described above for FIG. 3.

In some embodiments, reference buffer 400 may serve as the reference buffer 110 for a SAR ADC such as ADC 100 described above. Reference buffer 400 may be implemented in any suitable fashion according to the operation described in the present disclosure. In some embodiments, reference buffer 400 may include amplifier 410, sample circuit 440, and buffer circuit 380.

Amplifier 410 may be a chopped operational amplifier. Thus, for the purposes of the present disclosure, amplifier 410 may also be referred to as a chopper amplifier. As described in further detail below, amplifier 410 may have first and second chopper phases that may align in an alternating manner with repeated closed-loop phases of reference buffer 400. During these closed-loop phases, amplifier 410 may amplify a difference between the reference output voltage VREF_OUT and the reference input voltage VREF_IN, and may provide an amplifier output voltage to sample circuit 440.

Amplifier 410 may be implemented in any suitable fashion according to the operation described in the present disclosure. Amplifier 410 may include input stage 406 and output stage 407. Although input stage 406 and output stage 407 are described below as separate stages of amplifier 410, input stage 406 and output stage 407 may in some embodiments both be formed by a single amplification stage of a single-stage amplifier.

Input stage 406 may include transistors 315 and 316 and current sources 317, 318, and 319. A first input node 401 of amplifier 410 may be coupled to the gate of transistor 315, and a second input node 402 of amplifier 410 may be coupled to the gate of transistor 316. Transistors 315 and 316 may form a differential pair, with their respective sources coupled together at node 403. Transistors 315 and 316 may be biased by current source 317, which may be coupled between node 403 and ground GND. Further, transistor 315 may have a drain coupled to current source 318 at node 404, and transistor 316 may have a drain coupled to current source 319 at node 405. Current source 318 and 319 may be configured to source the same amount of current as each other. For example, current sources 318 and 319 may in some embodiments be two matching branches of a current mirror circuit configured to output matching currents. The differential pair formed by transistors 315 and 316 may draw different amounts of current from nodes 404 and 405 respectively based on the difference in the voltage levels received at the first input node 401 and second input node 402. Accordingly, different amounts of current may be provided to output stage 407 of amplifier 410. Specifically, different amounts of current may be provided to transistors 320 and 321 of output stage 407 based on the difference in the voltage levels received at the first and second input nodes 401 and 402.

Output stage 407 may include transistors 320 and 321 as well as transistors 322 and 323. Transistors 320 and 321 may be configured as a cascode with their respective gates both driven by a bias voltage VBIAS. Transistor 320 may have a source coupled to the drain of transistor 316 at node 405. Transistor 321 may similarly have a source coupled to the drain of transistor 315 at node 404. Transistor 322 may have a drain coupled to the drain of transistor 320, and a source coupled to ground GND. Transistor 323 may have a drain coupled to the drain of transistor 321 and a source coupled to ground GND. As described in further detail below, first switch circuit 425 formed by switches 420, 421, 422, and 423, may be utilized to alternate the output polarity of output stage 407. During a one chopper phase, the gates of transistors 322 and 323 may be coupled to the drain of one of transistors 322 and 323 to form a current mirror, and the drain of the other of transistors 322 and 323 may be coupled to the amplifier output 409. Accordingly, output stage 407 of amplifier 410 may provide an amplifier output voltage at amplifier output 409 based on the difference between the voltage levels received at the first input node 401 and the second input node 402 of amplifier 410.

In addition to the aforementioned transistors and current sources, amplifier 410 may also include various switching circuits and switches to provide a chopper function that alternates the polarity of the internal circuitry of amplifier 410. For example, as shown in FIG. 4, amplifier 410 may include first switch circuit 425 and second switch circuit 415.

In some embodiments, first switch circuit 425 may have a first plurality of switches, including switches 420, 421, 422, 423, that may be coupled to output stage 407 of amplifier 410, and may be configured to alternate the output polarity of output stage 407 based on the first and second chopper phases. For example, switches 420 and 421 may be driven by a first chopper signal S1 during a first chopper phase. When S1 is asserted during the first chopper phase to drive switches 420 and 421 in a closed state, switch 420 may couple the gates of transistors 322 and 323 to the drain of transistor 322, and switch 421 may couple the drain of transistor 323 to amplifier output 409. Conversely, switches 422 and 423 may be driven by a second chopper signal S2 during a second chopper phase. When S2 is asserted during the second chopper phase to drive switches 422 and 423 in a closed state, switch 422 may couple the gates of transistors 322 and 323 to the drain of transistor 323, and switch 423 may couple the drain of transistor 322 to the amplifier output 409. Accordingly, the output polarity of output stage 407, and specifically the polarity of the current mirror formed by transistors 322 and 323, may be alternated by alternating the first and second chopper signals S1 and S2 during the corresponding first and second chopper phases.

To conform the input polarity of input stage 406 of amplifier 410 with the alternating output polarity of output stage 407, amplifier 410 may also include a second switch circuit 415 coupled to input stage 406 of amplifier 410. For example, second switch circuit 415 may have a second plurality of switches, including switches 411, 412, 413, and 414, coupled to input stage 406 of amplifier 410 and configured to alternate the input polarity of input stage 406 based on the first and second chopper phases.

In some embodiments, switches 411 and 412 may be driven by a first chopper signal S1 during a first chopper phase. When S1 is asserted during the first chopper phase to drive switches 411 and 412 in a closed state, switch 411 may couple the first input 301 to the gate of transistor 315 at first input node 401, and switch 412 may couple the second input 302 to the gate of transistor 316 at second input node 402. Conversely, switches 413 and 414 may be driven by a second chopper signal S2 during a second chopper phase. When S2 is asserted during the second chopper phase to drive switches 413 and 414 in a closed state, switch 413 may couple the first input 301 to the gate of transistor 316 at second input node 402, and switch 414 may couple the second input 302 to the gate of transistor 315 at first input node 401. Accordingly, the polarity of the differential pair formed by transistors 315 and 316 may be alternated by alternating the first and second chopper signals S1 and S2 during the corresponding first and second chopper phases.

In sum, amplifier 410 may have first and second chopper phases that may align in an alternating manner with repeated closed-loop phases of reference buffer 400. When one of S1 and S2 are asserted, input stage 406 of amplifier 410 may be coupled by second switch circuit 415 to receive VREF_OUT and VREF_IN. Likewise, output stage 407 of amplifier 410 may be coupled by first switch circuit 425 to sample circuit 440. Thus, when one of S1 and S2 are asserted, reference buffer 400 may operate in a closed loop. Moreover, when one of S1 and S2 are asserted during a closed-loop phase, amplifier 410 may amplify a difference between the reference output voltage VREF_OUT and the reference input voltage VREF_IN, and may further provide an amplifier output voltage to sample circuit 440.

By alternating the polarity of input stage 406 and output stage 407 during the first and second chopper phases, any offset present in amplifier 410 due to imperfections in the semiconductor manufacturing process may have a first value during the first chopper phase and may have a second value during the second chopper phase, with the second value having an equal magnitude and an opposite polarity to the first value. For example, if a +10 mV offset is present in amplifier 410 during the first chopper phase, the alternating polarities of the internal circuitry of amplifier 410 would thus produce an offset of −10 mV during the second chopper phase. As described in further detail below, the output of amplifier 410 may be filtered such that any offset generated during the first chopper phase may be offset by the equal and opposite offset generated during the second chopper phase.

As shown in FIG. 4, sample circuit 440 may have an input 450 coupled to the amplifier output 409 of amplifier 410. Sample circuit 440 may be implemented in any suitable fashion according to the operation described in the present disclosure. As described in further detail below, sample circuit 440 may be configured to sample the amplifier output voltage from amplifier 410 during closed-loop phases of reference buffer 400, and may provide the sampled voltage level to buffer circuit 380.

In some embodiments, sample circuit 440 may be implemented as a switched notch filter including a plurality of switches and a plurality of capacitors. For example, as shown in FIG. 4, sample circuit 440 may include switches 441, 442, 443, and 444, as well as capacitors 446 and 447. Capacitor 446 may be coupled between node 454 and ground GND. Capacitor 447 may be coupled between node 455 and ground GND. Switches 441 and 442 may be driven by a first sample signal SN. When SN drives switches 441 and 442 in a closed state, switch 441 may couple input 450 to capacitor 446 at node 454, and switch 442 may couple capacitor 447 at node 455 to output 451 of sample circuit 440. Conversely, switches 443 and 444 may be driven by a second sample signal SNN. The second sample signal SNN may be the inverse of the first sample signal SN. For example, when SN is at a logic-high level, SNN may be at a logic-low level. Likewise, when SN is at a logic-low level, SNN may be at a logic-high level. When SNN drives switches 443 and 444 in a closed state, switch 443 may couple input 450 to capacitor 447 at node 455, and switch 444 may couple capacitor 446 at node 454 to the output 451 of sample circuit 440. As described in further detail below with reference to the timing diagram of FIG. 5, capacitors 446 and 447 of sample circuit 440 may alternate between sampling the amplifier output voltage during consecutive first and second chopper phases and providing the filtered sample voltage to buffer input 381 of buffer circuit 380.

As shown in FIG. 4, reference buffer 400 may include buffer circuit 380. Buffer circuit 380 may have a buffer input 381 coupled to an output 451 of sample circuit 355, and a buffer output coupled 382 to provide VREF_OUT. Buffer circuit 380 may be implemented in any suitable fashion according to the operation described in the present disclosure. Buffer circuit 380 may generate and provide the voltage reference output VREF_OUT with a voltage level corresponding to the voltage received at its buffer input 381. For example, buffer circuit 380 may generate and provide VREF_OUT at a voltage level with a constant offset from the sampled voltage received at its buffer input 381. In some embodiments, buffer circuit 380 may include a flipped voltage follower. For example, buffer circuit 380 may include transistor 383, transistor 384, and current source 385. Transistors 383 and 384 may be PMOS transistors. Transistor 383 may have a drain coupled to current source 385 at node 388. Current source 385 may be coupled between node 388 and ground GND and may bias transistor 383. Transistor 383 may also have a gate coupled to buffer input 381 and a source coupled to buffer output 382. Further, transistor 384 may include a gate coupled to node 388, a source coupled to VDD, and a drain coupled to the source of transistor 383 at buffer output 382 of buffer circuit 380. Thus, as shown in FIG. 3, transistor 383 of buffer circuit 380 may operate as a flipped voltage follower biased by transistor 384 and current source 385. The flipped voltage-follower configuration may provide for a constant offset from buffer input 381 to buffer output 382 based on the gate-to-source voltage of transistor 383 under the bias of current source 385 and transistor 384.

Figure 5:
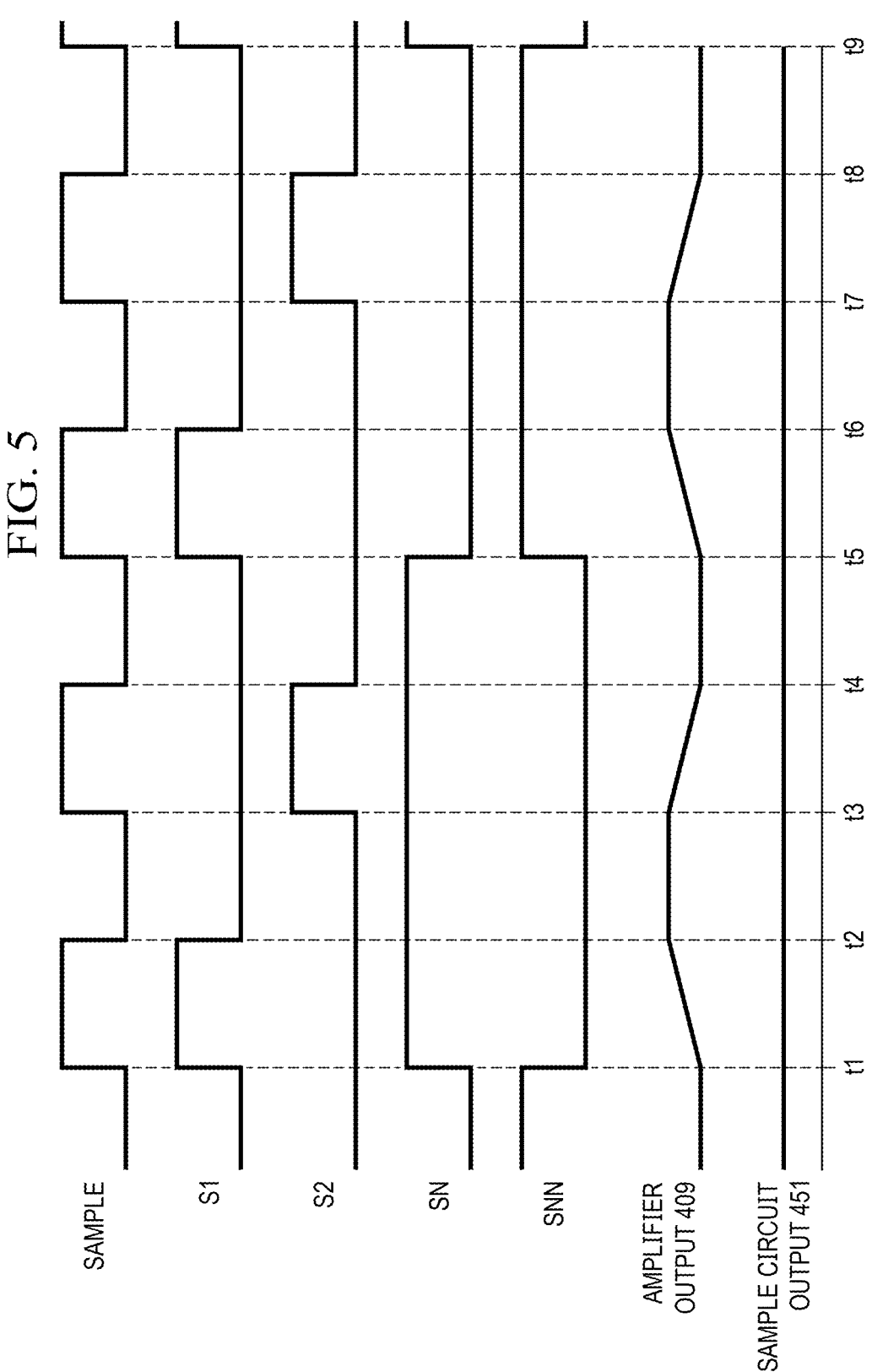
FIG. 5 illustrates a plot diagram of waveforms within a reference buffer in accordance with embodiments of the present disclosure.

FIG. 5 illustrates a plot diagram of waveforms for reference buffer 400 in accordance with embodiments of the present disclosure. The logic-high level of the SAMPLE signal may correspond to the sample phase of the SAR ADC, and the logic-low level of the SAMPLE signal may correspond to the conversion phase of the SAR ADC.

As shown in FIG. 5, the first and second chopper phases may be interleaved with the separate sample and conversion phases of the SAR ADC in which reference buffer 400 may be implemented. For example, the first chopper signal S1 corresponding to the first chopper phase may be asserted during the first sample phase of the SAR ADC between times t1 and t2. Subsequently, the second chopper signal S2 corresponding to the second chopper phase may be asserted during the second sample phase of the SAR ADC between times t3 and t4. This order may be repeated. For example, the first chopper signal S1 may be asserted again during a third sample phase of the SAR ADC between times t5 and t6, and the second chopper signal S2 may be asserted again during a fourth sample phase of the SAR ADC between times t7 and t8.

As described above with reference to FIG. 4, when one of S1 and S2 are asserted, reference buffer 400 may operate in a closed loop. For example, when one of S1 and S2 are asserted, input stage 406 of amplifier 410 may be coupled by second switch circuit 415 to receive VREF_OUT and VREF_IN. Likewise, output stage 407 of amplifier 410 may be coupled by first switch circuit 425 to sample circuit 440. Thus, when one of S1 and S2 are asserted, amplifier 410 may amplify a difference between the reference output voltage VREF_OUT and the reference input voltage VREF_IN, and may further provide an amplifier output voltage to sample circuit 440. Accordingly, the repeated chopper phases of reference buffer 400 during which one of S1 and S2 are asserted may correspond to repeated successive sample phases of the SAR ADC.

As shown in FIG. 5, the first and second chopper signals S1 and S2 may both be unasserted during the conversion phases of the SAR ADC in which reference buffer 400 may be implemented. For example, during the conversion phases between times t2 and t3, between times t4 and t5, between times t6 and t7, and between times t8 and t9, the first and second chopper signals S1 and S2 may both be unasserted.

As described above with reference to FIG. 4, when both S1 and S2 are unasserted, reference buffer 400 may operate in an open loop. For example, when both S1 and S2 are unasserted, first switch circuit 425 may isolate sample circuit 440 from output stage 407 of amplifier 410. Further, when both S1 and S2 are unasserted, second switch circuit 415 may isolate input stage 406 of amplifier 410 from VREF_OUT at the output of reference buffer 400. During such open-loop phases of reference buffer 400, buffer circuit 380 may continue to provide the reference output voltage VREF_OUT, based on the sampled voltage held by sample circuit 440. Accordingly, the repeated open-loop phases of reference buffer 400 during which both of S1 and S2 are unasserted may correspond to repeated successive conversion phases of the SAR ADC.

As also shown in FIG. 5, the sample signals SN and SNN driving the switches of sample circuit 440 may be asserted in an alternating fashion. In some embodiments, the sample signals SN and SNN driving the switches of sample circuit 440 may be asserted in an alternating fashion at a frequency that is one-fourth the frequency of the SAMPLE signal driving the SAR ADC.

As illustrated in FIG. 5 for example, the assertion of SN may span from time t1 to time t5 and may thus encompass an instance of the first chopper phase during which S1 is asserted, and an instance of the second chopper phase during which S2 is asserted. At time t5, SN may be de-asserted and SNN may be asserted. The assertion of SNN may span from time t5 to time t9 and may thus also encompass an instance of the first chopper phase during which S1 is asserted, and an instance of the second chopper phase during which S2 is asserted.

Referring back to FIG. 4, sample circuit 440 may include a switched notch filter that may sample and filter the amplifier output voltage across cycles of the first chopper phase and the second chopper phase. For example, when SN is asserted from time t1 to time t5, capacitor 446 of sample circuit 440 may sample the amplifier output voltage across both a first chopper phase and a second chopper phase. As described above with reference to FIG. 4, to the extent that any offset is present in amplifier 410 during the first chopper phase when chopper signal S1 is asserted, amplifier 410 may have an equal and opposite offset during the second chopper phase when chopper signal S2 is asserted. Thus, by sampling the amplifier output voltage from time t1 to time t5, capacitor 446 may filter out the equal and opposite offsets of amplifier 410 from the first chopper phase and the second chopper phase.

At time t5, SN may be de-asserted and SNN may be asserted. The filtered voltage sampled by capacitor 446 may thus be provided at time t5 to buffer input 381 of buffer circuit 380. And as described above, buffer circuit 380 may generate and provide the voltage reference output VREF_OUT with a voltage level corresponding to the voltage received at its buffer input 381. Moreover, like capacitor 446 from time t1 to time t5, when SNN is asserted from time t5 to time t9, capacitor 447 of sample circuit 440 may sample the amplifier output voltage across both a first chopper phase and a second chopper phase. Thus, while sampling the amplifier output voltage from time t5 to time t9, capacitor 447 may filter out the equal and opposite offsets from the first chopper phase and the second chopper phase.

At time t9, SNN may be de-asserted and SN may again be asserted. The filtered voltage sampled by capacitor 447 may thus be provided at time t9 to buffer input 381 of buffer circuit 380. And as described above, buffer circuit 380 may continue to generate and provide the voltage reference output VREF_OUT with a voltage level corresponding to the voltage received at its buffer input 381. After time t9, the alternating assertion of SN and SNN may repeat, and capacitors 446 and 447 of sample circuit 440 may continue to alternately sample the amplifier output voltage and provide the filtered sample voltage to buffer circuit 380.

The interleaving of chopper phases with open-loop and closed-loop phases for reference buffer 400 provides multiple advantages. The open-loop phases of reference buffer 400 may correspond to the conversion phases of a SAR ADC such as ADC 100 described above with reference to FIG. 1. During these phases, the output of reference buffer 400 may be subject to a switched capacitive loading of a capacitive DAC such as DAC 120. The open-loop configuration of reference buffer 400 during these phases provides a high-bandwidth, low-impedance output, capable of driving the switching load of a capacitive DAC. For example, the flipped voltage-follower configuration of buffer circuit 380 provides a low-impedance output that can quickly respond to a switching capacitive load at its output. Moreover, buffer circuit 380 only requires a small bias current, of for example, 10 μA, 1 μA, or less to bias the gate of transistor 384 and the flipped voltage-follower configuration of transistor 383. The flipped voltage-follower configuration may require less current to achieve the same bandwidth compared to a conventional voltage follower biased by a current source alone. The bias current consumed by reference buffer 300 as whole may thus be much less than the bias current that would otherwise be necessary to achieve a similar high-bandwidth with a continuously closed-loop system.

The closed-loop phases of reference buffer 400 may correspond to the sampling phases of a SAR ADC such as ADC 100 described above. During these phases, the output of reference buffer 400 may not have the same switched capacitive loading as during the conversion phases of the SAR ADC. However, any offset in the closed loop due to amplifier 410 would translate to gain error for the SAR ADC in which reference buffer 400 may be implemented. Accordingly, reference buffer 400 may be configured to favor low offset as opposed to high-bandwidth during this closed-loop phase. For example, as described above, reference buffer 400 may utilize alternating chopper phases to cancel any offset that may otherwise be present in amplifier 410 during the closed-loop phases. Accordingly, reference buffer 400 may minimize any gain error contributed to the SAR ADC in which reference buffer 400 may be implemented.

Although the reference buffers disclosed herein have been described in the context of SAR ADC, reference buffer 110, reference buffer 300, and reference buffer 400 may also be utilized in other applications. The advantages of the reference buffers disclosed herein may equally apply to any system in which a reference signal or other signal may drive a load that may have alternating characteristics, such as a load that may be stable during a first phase and that may vary during a second phase.

FIG. 6 illustrates a method for buffering a reference voltage in accordance with embodiments of the present disclosure. Method 600 may be performed by any suitable mechanism, such as amplifier 310, sample circuit 355, and buffer circuit 380 of reference buffer 300, or by amplifier 410, sample circuit 440, and buffer circuit 380 of reference buffer 400, or any suitable combination thereof. Method 600 may be performed with fewer or more steps than shown in FIG. 6. Moreover, steps of method 600 may be omitted, repeated, performed in parallel, performed in a different order than shown in FIG. 6, or performed recursively. One or more steps of method 600, although shown in an order, may be performed at the same time or in a re-ordered manner.

At step 602, a difference between a reference input voltage and a reference output voltage of a reference buffer may be amplified during a closed-loop phase of the reference buffer. For example, when S1 is asserted during the first chopper phase or S2 is asserted during the second chopper phase, input stage 406 of amplifier 410 may be coupled by second switch circuit 415 to receive VREF_OUT and VREF_IN. Likewise, output stage 407 of amplifier 410 may be coupled by first switch circuit 425 to sample circuit 440. Thus, when one of S1 and S2 are asserted, reference buffer 400 may operate in a closed loop. Moreover, when one of S1 and S2 are asserted during a closed-loop phase, amplifier 410 may amplify a difference between the reference output voltage VREF_OUT and the reference input voltage VREF_IN, and may provide an amplifier output voltage to sample circuit 440.

At step 604, an output of an amplifier may be sampled with a sample circuit during the closed-loop phase. For example, sample circuit 440 may have an input 450 coupled to the amplifier output 409 of amplifier 410. Sample circuit 440 may sample an amplifier output voltage at the amplifier output 409 of amplifier 410 during both the first chopper phase and the second chopper phase.

At step 606, a sampled voltage may be buffered to generate the reference output voltage. For example, an amplifier output voltage sampled and filtered by sample circuit 440 may be provided to buffer input 381 of buffer circuit 380. Buffer circuit 380 may generate and provide the reference output voltage VREF_OUT with a voltage level corresponding to the voltage received at its buffer input 381.

At step 608, the sample circuit may be isolated from an output stage of the amplifier during an open-loop phase of the reference buffer. For example, as described above with reference to FIG. 4, sample circuit 440 may be isolated from output stage 407 of amplifier 410 during an open-loop phase of reference buffer 400. For example, when both S1 and S2 are unasserted, reference buffer may operate in an open loop. With S1 and S2 both unasserted, each of switches 420, 421, 422, and 423 of first switch circuit 425 may be in an open state. Accordingly, first switch circuit 425 may isolate sample circuit 440 from output stage 407 of amplifier 410 during the open-loop phase of reference buffer 400.

At step 610, an input stage of the amplifier may be isolated from the reference output voltage of the reference buffer during the open-loop phase. For example, as described above with reference to FIG. 4, input stage 406 of amplifier 410 may be isolated from the reference output voltage VREF_OUT at the output of reference buffer 400 during an open-loop phase of reference buffer 400. For example, when both S1 and S2 are unasserted, reference buffer may operate in an open loop. With S1 and S2 both unasserted, each of switches 411, 412, 413, and 414 of second switch circuit 415 may be in an open state. Accordingly, second switch circuit 415 may isolate input stage 406 of amplifier 410 from the reference output voltage VRE-F_OUT at the output of reference buffer 400 during the open-loop phase.

At step 612, the amplifier may alternate between a first chopper phase and a second chopper phase. For example, amplifier 410 may be a chopper amplifier with a first chopper phase and a second chopper phase. The first chopper signal S1 may be asserted during the first chopper phase, and the second chopper signal S2 may be asserted during the second chopper phase. As shown in FIG. 5, amplifier 410 may alternate between the first chopper phase with S1 asserted and the second chopper phase with S2 asserted during each successive closed-loop phase of the reference buffer 400. Thus, after reference buffer 400 cycles through a closed-loop phase and a corresponding open-loop phase, amplifier 410 may alternate from one of the first and second chopper phases to the other of the first and second chopper phases. Method 600 may then return to step 602, and a cycle of a closed-loop phase and open-loop phase of reference buffer 400 may repeat.

Although examples have been described above, other modifications and variations may be made from this disclosure without departing from the spirit and scope of these examples. The above descriptions of various embodiments illustrate the principles of the invention. Numerous variations and modifications will become apparent to those skilled in the art based on the above disclosure. The following claims are intended to embrace all such variations and modifications.

The invention claimed is:

1. A reference buffer, comprising:
an amplifier configured to amplify a difference between a reference output voltage and a reference input voltage during a closed-loop phase of the reference buffer;
a sample circuit configured to sample an amplifier output voltage during the closed-loop phase;
a buffer circuit having a buffer input coupled to the sample circuit and a buffer output configured to provide the reference output voltage to an output of the reference buffer;
a first switch circuit coupled to an output stage of the amplifier and to the sample circuit, the first switch circuit configured to isolate the sample circuit from the output stage of the amplifier during an open-loop phase of the reference buffer; and
a second switch circuit coupled to the output of the reference buffer and to an input stage of the amplifier, the second switch circuit configured to isolate the input stage from the output of the reference buffer during the open-loop phase.

2. The reference buffer of claim 1, wherein the reference buffer is configured to repeatedly alternate between the closed-loop phase and the open-loop phase.

3. The reference buffer of claim 2, wherein the amplifier is a chopper amplifier having a first chopper phase and a second chopper phase, the first and second chopper phases aligning in an alternating manner with repeated closed-loop phases of the reference buffer.

4. The reference buffer of claim 3, wherein:
the first switch circuit includes a first plurality of switches coupled to the output stage of the amplifier and configured to alternate an output polarity of the output stage of the amplifier based on the first and second chopper phases; and
the second switch circuit includes a second plurality of switches coupled to the input stage of the amplifier and configured to alternate an input polarity of the input stage of the amplifier based on the first and second chopper phases.

5. The reference buffer of claim 3, wherein the sample circuit comprises a switched notch filter including a plurality of capacitors.

6. The reference buffer of claim 1, wherein the sample circuit comprises a capacitor configured to sample the amplifier output voltage during the closed-loop phase and to hold a sampled voltage level during the open-loop phase.

7. The reference buffer of claim 1, wherein the buffer circuit comprises a flipped voltage follower.

8. An analog-to-digital (ADC) converter, comprising:
a capacitive digital-to-analog converter (DAC) configured to receive an input voltage and a digital feedback signal;
a comparator coupled to the DAC and configured to generate a comparison signal based on a DAC output;
a successive-approximation register (SAR) coupled to receive the comparison signal and to provide the digital feedback signal to the capacitive DAC; and
a reference buffer configured to receive a reference input voltage and to provide a reference output voltage to the capacitive DAC, the reference buffer comprising:
an amplifier configured to amplify a difference between the reference output voltage and the reference input voltage during a closed-loop phase of the reference buffer;
a sample circuit configured to sample an amplifier output voltage during the closed-loop phase;
a buffer circuit having a buffer input coupled to the sample circuit and a buffer output configured to provide the reference output voltage to an output of the reference buffer;
a first switch circuit coupled to an output stage of the amplifier and to the sample circuit, the first switch circuit configured to isolate the sample circuit from the output stage of the amplifier during an open-loop phase of the reference buffer; and
a second switch circuit coupled to the output of the reference buffer and to an input stage of the amplifier, the second switch circuit configured to isolate the input stage from the output of the reference buffer during the open-loop phase.

9. The ADC of claim 8, wherein the reference buffer is configured to repeatedly alternate between the closed-loop phase and the open-loop phase, wherein repeated closed-loop phases correspond to repeated sample phases of the ADC and repeated open-loop phases correspond to repeated conversion phases of the ADC.

10. The ADC of claim 9, wherein the amplifier is a chopper amplifier having a first chopper phase and a second chopper phase, the first and second chopper phases aligning in an alternating manner with repeated closed-loop phases of the reference buffer.

11. The ADC of claim 10, wherein:

the first switch circuit includes a first plurality of switches coupled to the output stage of the amplifier and configured to alternate an output polarity of the output stage of the amplifier based on the first and second chopper phases; and the second switch circuit includes a second plurality of switches coupled to the input stage of the amplifier and configured to alternate an input polarity of the input stage of the amplifier based on the first and second chopper phases.

12. The ADC of claim 10, wherein the sample circuit comprises a switched notch filter including a plurality of capacitors.

13. The ADC of claim 8, wherein the sample circuit comprises a capacitor configured to sample the amplifier output voltage during the closed-loop phase and to hold a sampled voltage level during the open-loop phase.

14. The ADC of claim 8, wherein the buffer circuit comprises a flipped voltage follower.

15. A method for buffering a reference voltage, comprising:

amplifying a difference between reference input voltage and a reference output voltage of a reference buffer during a closed-loop phase of the reference buffer;

sampling an output of an amplifier with a sample circuit during the closed-loop phase;

buffering a sampled voltage to generate the reference output voltage;

isolating the sample circuit from an output stage of the amplifier during an open-loop phase of the reference buffer; and isolating an input stage of the amplifier from reference output voltage of the reference buffer during the open-loop phase.

16. The method of claim 15, further comprising alternating between repeated closed-loop phases and repeated open-loop phases.

17. The method of claim 15, further comprising alternating the amplifier between a first chopper phase and a second chopper phase.

18. The method of claim 17, wherein the first and second chopper phases align in an alternating manner with repeated closed-loop phases of the reference buffer.

19. The method of claim 17, further comprising:

alternating an input polarity of the input stage of the amplifier based on the first and second chopper phases; and alternating an output polarity of the output stage of the amplifier based on the first and second chopper phases.

20. The method of claim 17, further comprising filtering the output of the amplifier with a switched notch filter.

* * * * *